(12) United States Patent
Gronenborn et al.

(10) Patent No.: US 10,381,802 B2
(45) Date of Patent: Aug. 13, 2019

(54) LIGHT EMITTING DEVICE

(71) Applicant: PHILIPS PHOTONICS GMBH, Ulm (DE)

(72) Inventors: Stephan Gronenborn, Aachen (DE); Michael Miller, Ulm (DE); Peter Dannberg, Aachen (DE); Mark Schuermann, Aachen (DE); Holger Moench, Vaals (NL)

(73) Assignee: PHILIPS PHOTONICS GMBH, Ulm (DE)

( * ) Notice: Subject to any disclaimer, the term of this patent is extended or adjusted under 35 U.S.C. 154(b) by 0 days.

(21) Appl. No.: 15/762,277

(22) PCT Filed: Sep. 22, 2016

(86) PCT No.: PCT/EP2016/072498
§ 371 (c)(1),
(2) Date: Mar. 22, 2018

(87) PCT Pub. No.: WO2017/055160
PCT Pub. Date: Apr. 6, 2017

(65) Prior Publication Data
US 2018/0278024 A1   Sep. 27, 2018

(30) Foreign Application Priority Data
Oct. 1, 2015   (EP) .................................... 15187849

(51) Int. Cl.
*H01S 5/18* (2006.01)
*H01S 5/183* (2006.01)
(Continued)

(52) U.S. Cl.
CPC ........ *H01S 5/18388* (2013.01); *H01S 5/0283* (2013.01); *H01S 5/0421* (2013.01);
(Continued)

(58) Field of Classification Search
CPC .. H01S 5/18388; H01S 5/0283; H01S 5/0421; H01S 5/423; H01S 5/0042; H01S 5/0201; H01S 2301/17
See application file for complete search history.

(56) References Cited

U.S. PATENT DOCUMENTS

| 7,429,915 B2 | 9/2008 | Cruzado et al. |
| 2003/0009683 A1 | 1/2003 | Schwenck et al. |

(Continued)

FOREIGN PATENT DOCUMENTS

EP   1460738 A2   9/2004

OTHER PUBLICATIONS

Gimkiewicz, et al., "Wafer-scale replication and testing of micro-optical components for VCSELs", vol. 5453, Sep. 8, 2004, pp. 13-26.

*Primary Examiner* — Armando Rodriguez
(74) *Attorney, Agent, or Firm* — Leydig, Voit & Mayer, Ltd.

(57) ABSTRACT

The invention describes a light emitting device (100). The light emitting device (100) comprises at least one light emitting structure (110), at least one processing layer (120) and at least one optical structure (130). The optical structure (130) comprises at least one material processed by means of processing light (150). The at least one processing layer (120) is arranged to reduce reflection of the processing light (150) in a direction of the optical structure (130) at least by 50%, preferably at least by 80%, more preferably at least by 95% and most preferably at least by 99% during processing of the material by means of the processing light (150). It is a basic idea of the present invention to incorporate a non- or low-reflective processing layer (120) on top of a light emitting structure (110) like a VCSEL array in order to enable on wafer processing of light emitting structures (130)

(Continued)

like microlens arrays. The invention further describes a method of manufacturing such a light emitting device (100).

12 Claims, 8 Drawing Sheets

(51) Int. Cl.
*H01S 5/028* (2006.01)
*H01S 5/042* (2006.01)
*H01S 5/42* (2006.01)
H01S 5/00 (2006.01)
H01S 5/02 (2006.01)

(52) U.S. Cl.
CPC ............ *H01S 5/423* (2013.01); *H01S 5/0042* (2013.01); *H01S 5/0201* (2013.01); *H01S 2301/17* (2013.01)

(56) References Cited

U.S. PATENT DOCUMENTS

| | | |
|---|---|---|
| 2003/0010431 A1 | 1/2003 | Feldman et al. |
| 2005/0101042 A1 | 5/2005 | Hasei |
| 2007/0009223 A1 | 1/2007 | Rudmann et al. |
| 2007/0103643 A1 | 5/2007 | Takeda et al. |
| 2007/0194337 A1 | 8/2007 | Kondo |
| 2012/0068326 A1 | 3/2012 | Das et al. |

LIGHT EMITTING DEVICE

CROSS-REFERENCE TO PRIOR APPLICATIONS

This application is the U.S. National Phase application under 35 U.S.C. § 371 of International Application No. PCT/EP2016/072498, filed on Sep. 22, 2016, which claims the benefit of European Application Serial No. 15187849.3, filed Oct. 1, 2015. These applications are hereby incorporated by reference herein, for all purposes.

FIELD OF THE INVENTION

The invention relates to a light emitting device and the method of manufacturing such a light emitting device.

BACKGROUND OF THE INVENTION

Light emitting devices as, for example, arrays of Light Emitting Diodes (LEDs) or Vertical Cavity Surface Emitting Lasers (VCSELs) are often used together with microlens arrays to improve the brightness of the complete array and/or to improve beam shaping. Microlens arrays are separately manufactured and actively aligned above the assembled VCSEL arrays with a dedicated machine. The process is relatively slow and costly.

SUMMARY OF THE INVENTION

It is an object of the present invention to provide an improved light emitting device and an improved method of manufacturing such a light emitting device.

According to a first aspect a light emitting device is provided. The light emitting device comprises at least one light emitting structure, at least one processing layer and at least one optical structure. The optical structure comprises at least one material processed by means of processing light. The at least one processing layer is arranged to reduce reflection of the processing light in a direction of the optical structure at least by 50%, preferably at least by 80%, more preferably at least by 95% and most preferably at least by 99% during processing of the material by means of the processing light.

The light emitting structure may be a semiconductor-based light emitting structure like a light emitting diode or a laser diode. Preferably, a multitude of light emitting devices are arranged next to each other in an array arrangement. The laser diode may be an edge emitting laser diode or preferably a Vertical Cavity Surface Emitting Laser (VCSEL). VCSEL may have the advantage that they can be produced and tested in parallel on a wafer. It is thus easy to combine a multitude of VCSEL in an array arrangement. Single light emitting structures like light emitting diodes or arrays like, for example, VCSEL arrays are often combined with optical structures like microlens arrays in order to improve the brightness of the arrays and/or beam shaping (increase the fill factor of arrays or shape the emission pattern). Using standard UV- or blue light curable polymers on top of a processed VCSEL wafer for processing microlens arrays on top of the wafer leads to cured polymer at places that should stay uncovered even if the curing light is structured by means of e.g. a shadow mask. While such a shadow mask works well in case of polymer arrays on e.g. glass substrates the lateral structure especially of the uppermost layer of the light emitting structure (e.g. gold layer of the VCSELs) may cause reflected light during solidification of the optical structure which is most likely responsible for curing the polymer on the bond pads or on the saw lines. Especially the bond pads for wirebonding and the saw lines may be covered by the cured polymer which is difficult to remove after the unwanted solidification. The cured polymer may, for example, contaminate the sawing blade of the wafer saw and/or prevent wirebonding. Many approaches to improve the shielding of the UV-light from the top and applying spacers that push the polymer away from the bond pads/sawing lanes were not successful. As a result of many experiments the processing layer has been used which is an integrated part of the light emitting device and enables replication of microlens arrays on, for example, the full VCSEL wafer and allows to eliminate unwanted solidification in regions to be kept free of the polymer. Separate production of microlens arrays and subsequent alignment with the light emitting structure is avoided. The processing layer may be adapted to absorb a significant part of the processing light which is used to solidify or cure the optical structure. Alternatively or in addition, the processing layer is adapted to avoid reflection at the laterally structured surface of the light emitting structure by enabling absorption by means of the subsequent layers with respect to the direction of emission of the processing light. The processing layer comprises in this case an antireflective coating enabling transmission of the processing light to the subsequent layer or layers where it may be absorbed. The processing layer may comprise one layer or a sequence of two, three, four or more sublayers. A multitude of sublayers may especially be useful in case that a broadband antireflective coating or a combination of antireflective coating and absorption layer. The processing layer may be transparent or non-transparent with respect to the light emitted by the light emitting structure. The processing layer has to be removed above a light emitting area of the light emitting structure in order to enable emission of light in case this layer is not transparent for the emitted light.

The at least one processing layer may be further adapted to avoid peeling off of the optical structure at a temperature of at least 200° C., more preferably of at least 220° C. and most preferably of at least 250° C.

The processing layer or a material of at least one sublayer of the processing layer may be chosen such that the coupling between the optical structure and the light emitting structure is improved especially at higher temperatures. The at least one processing layer improves adhesion of the optical structure on top of the light emitting structure. Peeling off especially at the edges of the optical structure at higher temperatures during, for example, soldering may be reduced by means of the at least one processing layer. Some soldering processes require temperatures of more than 300° C. or even 320° C.

The at least one material comprised by the optical structure comprises an ultraviolet or blue light curable polymeric material. The polymeric material may be an organic or inorganic material. The processing light comprises blue or ultraviolet light in the wavelength range between 250 nm and 450 nm, preferably in the wavelength range between 300 nm and 400 nm, most preferably in the wavelength range between 335 nm and 385 nm.

The polymeric material comprises preferably an acrylate, a methacrylate or thiol-ene based resin in combination with at least one photoinitiator. A photoinitiator may comprise any chemical compound that decomposes into free radicals when exposed to light. Photoinitiators are used to promote polymerization reactions. Photoinitiators are comprised, for example, in the chemical classes α-Hydroxyketone, Phenylglyoxylate, Benzyldimethyl-ketal, α-Aminoketone, Bis Acyl Phosphine, Metallocene, Phosphine oxide etc. or mixtures thereof.

The processing layer may comprise an antireflective coating. The antireflective coating is adapted to transmit the processing light to an absorption structure such that the reflection of the processing light is reduced by absorption by means of the absorption structure.

Two situations may be distinguished:

An antireflective coating is deposited or provided, for example, on the top metal layer of the light emitting structure. In this case the thickness is adapted according to the refractive and absorption coefficients. The absorption structure may be in this case the top metal layer of the light emitting structure.

A stack of at least two layers may be deposited on the top layer of the light emitting structure. An absorptive layer which may be similar or even identical with the absorption layer as described below may be deposited directly on the top layer of the light emitting structure (e.g. gold layer). The absorptive layer may in this case be the absorption structure. The absorptive layer may be reflective with respect to the processing light used to cure the optical structure because of its high imaginary part of the refractive index. An antireflection layer may be deposited as antireflective coating on top of the absorptive layer. The antireflection layer is adapted in accordance with the reflection properties of the absorptive or absorption layer in order to avoid reflection at the interface between the antireflection layer and the absorptive layer.

The antireflective coating and especially the thickness of the different layers has to be adapted such that varying incidence angles and polarization of the processing light is taken into account in order to reduce reflection of processing light as described above.

The thickness of the antireflective coating may be adapted such that processing light reflected at a first surface of the antireflective coating nearer to a source of the processing light destructively interferes with processing light reflected at a second surface of the antireflective coating which is directed away from the source of the processing light.

The antireflective coating may comprise intermediate metal layers a few nm thick which may be placed between oxide layers to reduce reflection further.

The anti-reflexion structure or antireflective coating may also comprise a moth-eye or gradient index structure.

The thickness of the antireflective coating strongly depends on the sequence of materials. The thickness of the antireflective coating may be in the range of a quarter of a wavelength of the processing light (taking into account the refractive index of the material of the antireflective coating) if the antireflective coating comprises one layer of dielectric material attached to another dielectric material.

The processing layer may, for example, comprise a metal layer mechanically coupled to the light emitting structure. The processing layer may further comprise a metal oxide layer attached to the metal layer. The metal oxide layer is the antireflective coating.

The metal oxide may preferably comprise at least one material selected out of the group of titanium oxide, zirconium oxide, tantalum oxide, silicon oxide, hafnium oxide or germanium oxide. Other metal oxides may be used depending on the wavelength range of the processing light, the material of the metal layer, the material of the top layer of the light emitting structure and the material of the optical structure.

The thickness of the antireflective coating has to be adapted to the combination of metal and metal oxide because of the complex refractive index of the metal. The thickness of the antireflective coating may in this case, for example, be thinner than a quarter of a wavelength of the processing light, for example, the thickness may be in the range of 45% to 80% of the quarter of the wavelength of the processing light, more preferably in the range of 50% to 70% of the quarter of the wavelength of the processing light and most preferably in the range of 55% to 60% of the quarter of the wavelengths of the processing light (taking into account in the calculation of the thickness the refractive index of the material of the antireflective coating). Alternatively, thicker antireflective coatings (adding integer multitudes of halve of the wavelength of the processing light to the thickness of the processing layer) may be used as long as the processing light reflective at the first surface destructively interferes with the processing light reflected at the second surface of the antireflective coating.

The metal oxide layer may preferably comprise an oxide of a material of the metal layer. The metal layer may, for example, be deposited on top of the light emitting structure. The surface of the metal layer pointing away from the light emitting structure may be oxidized (for example thermal oxidation) such that preferably a part of the metal layer is oxidized. The metal layer may enable a good adhesion to the light emitting structure and oxidation of a part of the metal layer enables good adhesion between the metal oxide layer and the metal layer. Especially thermal oxidation of metals may enable easy processing of the antireflective metal oxide layer with well-defined thickness. Alternatively, it may also be possible to deposit a metal oxide layer on top of the metal layer.

The light emitting device may comprise a light emitting structure with an electrode structure provided on top of the light emitting structure. The upper layer of the electrode structure may comprise gold in order to increase electrical conductivity and to enable easy wirebonding. The metal layer may be attached to or deposited on the surface of the gold layer of the electrode structure. The material of the metal layer may preferably be titanium because titanium sticks rather well to gold surfaces. The thickness of the titanium layer may be in the range between 30 nm to 200 nm, preferably in the range between 50 nm to 150 nm and most preferably in the range between 80 nm and 120 nm. The metal oxide layer may in this case be a titanium dioxide layer attached to the titanium layer. The titanium dioxide layer may preferably be processed by means of thermal oxidation as described above. The thickness of the titanium dioxide layer is chosen such that the processing light reflective at the upper surface destructively interferes with the processing light reflected at the interface between the titanium dioxide layer and the titanium layer. The thickness of the antireflective coating may be in the range between 10 nm and 20 nm, preferably between 12 nm and 18 nm and more preferably between 14 nm and 16 nm.

The processing layer may comprise an antireflective coating which comprises two, three, four or more layers in order to enable transmission of processing light at different wavelengths (broadband processing light) and/or at a broad range of incidence angles.

A material of the antireflective coating may preferably comprise at least one dielectric material, wherein the dielectric material comprises a metal oxide or metal nitride. Two, three, four or more layers of at least two different dielectric materials with different refractive indexes may be used in order to enable transmission of processing light at different wavelengths (broadband processing light) and/or at a broad range of incidence angles.

The absorption structure may comprise one or more layers of the light emitting device (e.g. top metal layer) as described above or below.

The absorption structure may alternatively or in addition comprise an absorption layer provided between the light emitting device (e.g. top metal layer) and the antireflective coating. The absorption layer is adapted to absorb the processing light such that the reflection of the processing light is reduced as described below.

The at least one processing layer may alternatively or in addition be adapted to absorb the processing light such that the reflection of the processing light is reduced. The processing layer is in this case an absorption layer.

The processing layer may preferably comprise a photoresist and a pigment, wherein the pigment is adapted to absorb the processing light. The processing light comprises blue or ultraviolet light in the wavelength range between 250 nm and 450 nm such that polymeric material as described above can be cured. The pigment may be, for example, a black color pigment in blue and near ultraviolet. Small carbon black particles may, for example, be distributed in the photoresist and may be used as pigment increasing absorption of the processing light within the absorption layer. The advantage of an absorption layer may be that no antireflective coating may be needed. The absorption layer may further work nearly at arbitrary angles of incidence.

The photoresist may comprise at least one of the materials selected out of the group Acrylate, Polymethylmethacrylate, Polymethylglutarimide or Polycarbonate. Furthermore, a material comprising a Phenolformaldehyde resin like SU 8 may be used as photoresist. The processing layer is characterized by a thickness of at least 0.5 μm, more preferably of at least 1 μm. The material or materials used for absorption and the corresponding thickness of the processing layer may be adapted such that reflection of the processing light in a direction of the optical structure is reduced by means of the absorption of the processing layer as described above.

The light emitting structure may comprise at least one Vertical Cavity Surface Emitting Laser (VCSEL) preferably a multitude of VCSELs which may be arranged in a one-dimensional or two dimensional array.

According to a further aspect a method of manufacturing a light emitting device is provided. The method comprising the steps of:
providing a light emitting structure,
providing at least one processing layer, wherein the processing layer is adapted to reduce reflection of processing light in a direction of at least one material for building an optical structure at least by 50%, preferably at least by 80%, more preferably at least by 95% and most preferably at least by 99%,
providing the at least one material for building the optical structure,
providing processing light for curing the at least one material to build the optical structure, and
coupling by means of the processing layer the optical structure with the light emitting structure.

The steps of the method are not necessarily performed in the order as described above. The step of coupling may, for example, be performed prior to the step of providing processing light.

The process step of providing at least one processing layer may comprise the step of providing or disposing an titanium layer and thermally oxidizing at least a part of the titanium layer to titanium oxide respectively titanium dioxide. The thickness of the thermal titanium dioxide may be chosen as described above.

It shall be understood that the light emitting device according to any one of claims 1 to 14 and the method of claim 15 have similar and/or identical embodiments, in particular, as defined in the dependent claims.

It shall be understood that a preferred embodiment of the invention can also be any combination of the dependent claims with the respective independent claim.

Further advantageous embodiments are defined below.

BRIEF DESCRIPTION OF THE DRAWINGS

These and other aspects of the invention will be apparent from and elucidated with reference to the embodiments described hereinafter.

The invention will now be described, by way of example, based on embodiments with reference to the accompanying drawings.

In the drawings.

DETAILED DESCRIPTION OF EMBODIMENTS

Various embodiments of the invention will now be described by means of the Figures.

Figure 1:
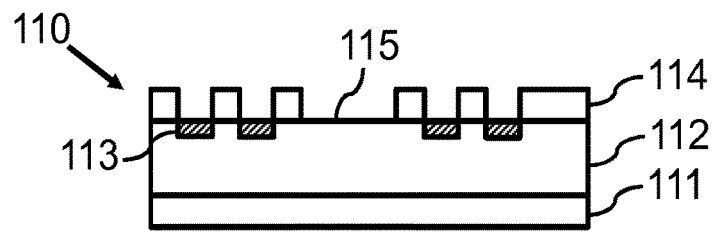
FIG. 1 shows a principal sketch of an example of a light emitting structure

FIG. 1 shows a principal sketch of an example of a wafer comprising light emitting structures 110. The light emitting structures 110 is in this case an array of VCSELs. The light emitting structures 110 comprise a first electrical contact 111 at the bottom, a semiconductor substrate 112 comprising the laser cavities with bottom and top DBRs and active layers in between. Furthermore, there may be a number of supporting layers such as buffer layers and the like. The light emitting structures 110 further comprise a multitude of light emitting areas 113 or more precisely volumes which are built by means of the active layers embedded between the resonator mirrors (DBRs). The light emitting structures 110 finally comprise a second electrical contact 114. The second electrical contact may comprise a sequence of layers, wherein the uppermost layer may be a gold layer in order to improve electrical conductivity. The light emitting structures 110 can be separated by sawing along saw line 115. The light emitting structure 110 may optionally comprise a protective coating on top of the second electrical contact 114. The protective coating may be structured or unstructured. An unstructured protective coating has to be transparent at the emission wavelengths of the light emitting structure 110.

FIG. 1 provides only a special example of a gallium arsenide based light emitting structures 110 which can emit laser light in a wavelength range between 750 and 1200 nm. Another example may be a gallium indium nitride based light emitting diode or array of light emitting diodes emitting light, for example, in the blue wavelength range.

Figure 2:
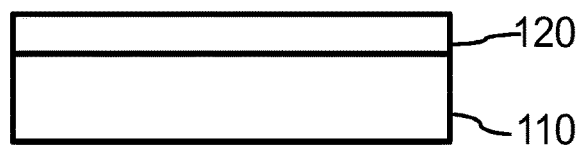
FIG. 2 shows a principal sketch of a first process step of processing a light emitting device

FIG. 2 shows a principal sketch of a first process step of processing a light emitting device 100. A processing layer 120 is provided on top of the uppermost layer of the light emitting structures 110 as, for example, described in FIG. 1. The processing layer 120 may optionally be removed in an etching or lift-off step in saw lines 115 and/or at light emission windows of the light emitting structure 110 and/or at the area of the bondpads. These regions or areas are covered by a shadow mask during UV-curing as described below. The processing layer 120 may be provided by depositing for example, a 100 nm layer of titanium and subsequently thermally oxidizing the surface of the titanium layer to titanium dioxide with a layer thickness of the titanium dioxide layer of, for example, 15 nm. The layer of titanium dioxide with the thickness of 15 nm causes destructive interference (at least at an angle of incidence of around 90°) of processing light with a wavelength of 365 nm reflected at the top surface of the titanium dioxide layer and the interface between the titanium and titanium dioxide. The layer of titanium dioxide is in this case an antireflective coating at the respective wavelength of 365 nm.

Figure 3:
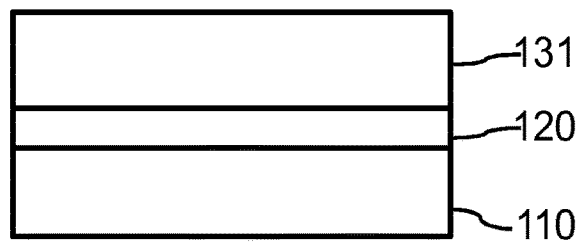
FIG. 3 shows a principal sketch of a second process step of processing the light emitting device

FIG. 3 shows a principal sketch of a second process step of processing the light emitting device 100. A layer of optical material 131 is provided on top of the processing layer 120. The optical material layer 131 is a material which is suitable to build the optical structure 130. The optical material layer 131 is transparent at the emission wavelengths of the light emitting devices 100 and can be processed by means of processing light with a wavelength of around 365 nm.

Figure 4:
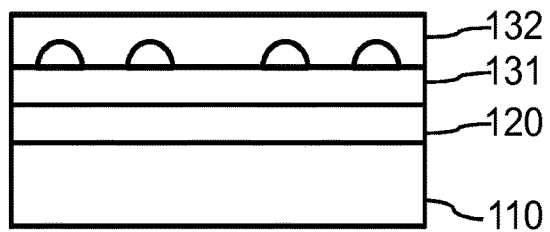
FIG. 4 shows a principal sketch of a third process step of processing the light emitting device

FIG. 4 shows a principal sketch of a third process step of processing the light emitting device 100. An optical forming structure 132 is provided in order to form, for example, an array of micro-lenses by means of the optical material layer 131. The optical forming structure 132 is transparent for the processing light with a wavelength of around 365 nm.

Figure 5:
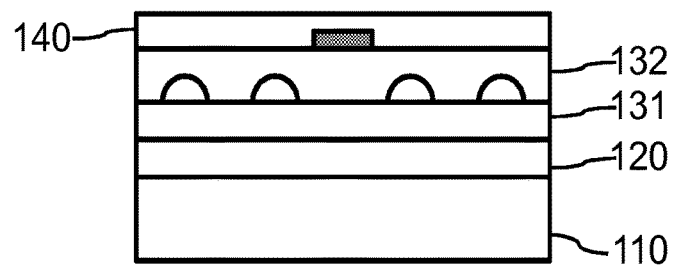
FIG. 5 shows a principal sketch of a fourth process step of processing the light emitting device

FIG. 5 shows a principal sketch of a fourth process step of processing the light emitting device 100. A shadow mask 140 is provided on top of the optical forming structure 132. The shadow mask 140 is arranged in this case such that essentially no processing light 150 is received in the volume of the optical material layer 131 above saw lines 115, light emission windows of the light emitting structure 110 and at the area of the bondpads (not shown) as indicated in FIG. 6.

Figure 6:
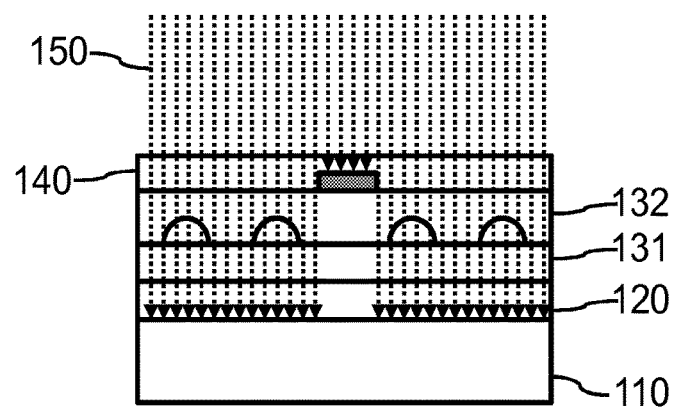
FIG. 6 shows a principal sketch of an embodiment of a fifth process step of processing the light emitting device

FIG. 6 shows a principal sketch of an embodiment of a fifth process step of processing the light emitting device 100. Processing light 150 cures or solidifies the optical material layer 131 which is formed by means of the optical forming structure 132. The processing layer 120 which comprises the 15 nm antireflection titanium dioxide layer avoids reflection of the processing light 150 at the interface between the optical material layer 131 and the uppermost layer of the light emitting structure 110. The uppermost layer of the light emitting structure 110 is a gold layer which improves the electrical conductivity of the second electrical contact 114. Especially the lateral structuring of the gold layer (edges of the structured gold layer) may cause reflection of processing light 150 in the volume of the optical material layer 131 which is shielded by the shadow mask 140. The titanium dioxide layer avoids reflection at the surface of the gold layer such that the processing light 150 can enter the volume of the gold layer. The gold layer absorbs the processing light 150 such that essentially no processing light 150 is reflected in regions covered by shielding structures of the shadow mask 140.

Figure 7:
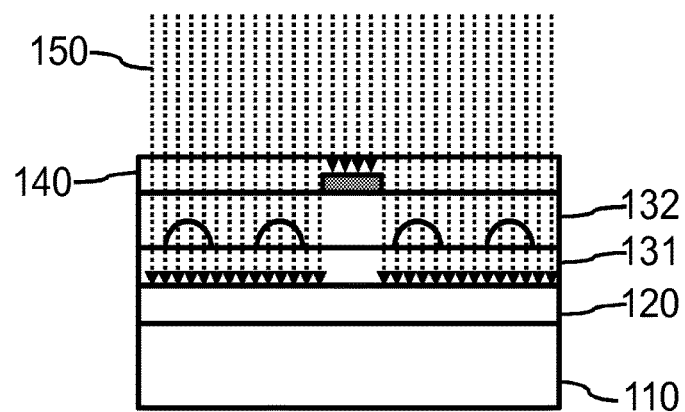
FIG. 7 shows a principal sketch of an another embodiment of a fifth process step of processing the light emitting device

FIG. 7 shows a principal sketch of another embodiment of a fifth process step of processing the light emitting device 100. The processing layer 120 comprises in this case a 1 μm layer of PMMA with nanometer-sized carbon black particles distributed in the PMMA layer. The refractive index of the PMMA layer is similar to the optical material layer 131 such that nearly no light is reflected at the interface between the optical material layer 131 and the PMMA layer. The processing light 150 enters the processing layer 120 and is absorbed by means of the PMMA and the carbon black particles. Such an absorptive processing layer 120 may have the advantage that the absorption is nearly independent with respect to the angle of incidence and that a broad range of wavelengths of processing light 150 can be absorbed.

Figure 8:
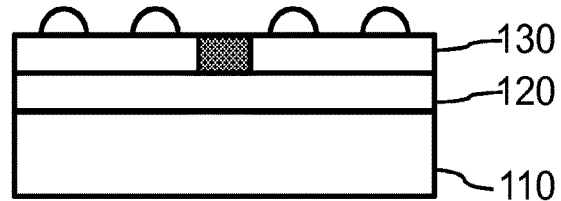
FIG. 8 shows a principal sketch of a sixth process step of processing the light emitting device

FIG. 8 shows a principal sketch of a sixth process step of processing the light emitting device 100. The shadow mask 140 and the optical forming structure 132 are removed.

Figure 9:
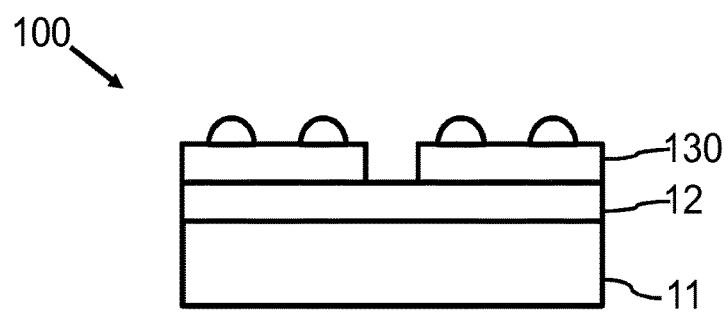
FIG. 9 shows a principal sketch of a seventh process step of processing the light emitting device

The material of the optical material layer 131 above saw line or sawing lane 115 (not shown) which was shielded or covered by means of the shadow mask 140 is removed in a seventh process step of processing the light emitting device 100 shown in FIG. 9. The material of the optical material layer 131 may, for example, be washed away because the material of the optical material layer 131 may be liquid if it is unexposed or uncured.

Figure 10:
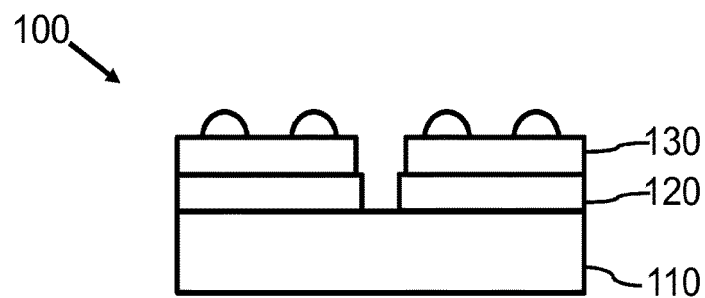
FIG. 10 shows a principal sketch of an eighth process step of processing the light emitting device

FIG. 10 shows an optional step of removing (e.g. etching) parts of the processing layer 120. The processing layer may, for example, be removed in saw lines 115 or above the bondpads. Removing of the processing layer 120 may only be necessary if it was not already structured after deposition of the processing layer 120. The process steps and sequence may be adapted depending on the materials involved.

Figure 11:
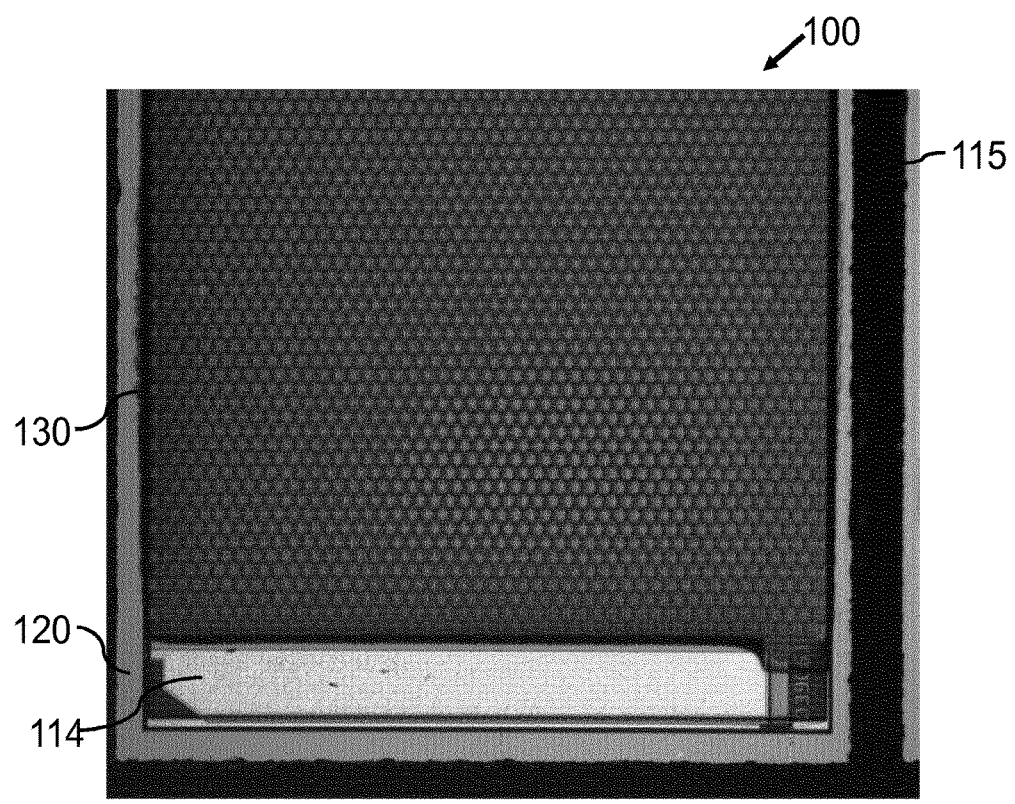
FIG. 11 shows a photograph of a light emitting device

FIG. 11 shows a photograph of a wafer comprising a light emitting device 100 which was processed in accordance with the steps discussed with respect to FIGS. 2 to 6 and 8 to 10. The photograph shows the light emitting structure 110 which is covered by an array of micro-lenses which is the optical structure 130. Furthermore, the processing layer 120 is shown which comprises the titanium dioxide layer with a thickness of 15 nm. The processing layer 120 was removed at the areas of the second electrical contact 114 which should be contacted by means of a wirebond. The photograph further shows that there is essentially no material of the optical structure 130 left in the saw line 115. The wafer with the light emitting devices 100 shown in FIG. 11 was subsequently heated to a temperature of 240° C. The optical structure 130 which consists of a polymer material which is sold under the trade mark OrmoComp® was not damaged by means of this subsequent heating step. OrmoComp® is an UV curable material for imprinting which is an acrylate (more precisely a trimethylol propane triacrylate TMPTA)

based Hybrid Polymer resin. Photopolymerization is enabled by means of a photoinitiator. Hybrid Polymer means that an inorganic $SiO_2$ based network is combined with UV-curable groups of acrylate. In other experiments optical structures 130 processed by means of UV imprinting resin of the Exfine™ CO series (CO150) of ChemOptics were successfully tested in combination with processing layer 120. The Exfine™ CO series are photoactive UV curable resins based on various multifunctional acrylate.

Figure 12:
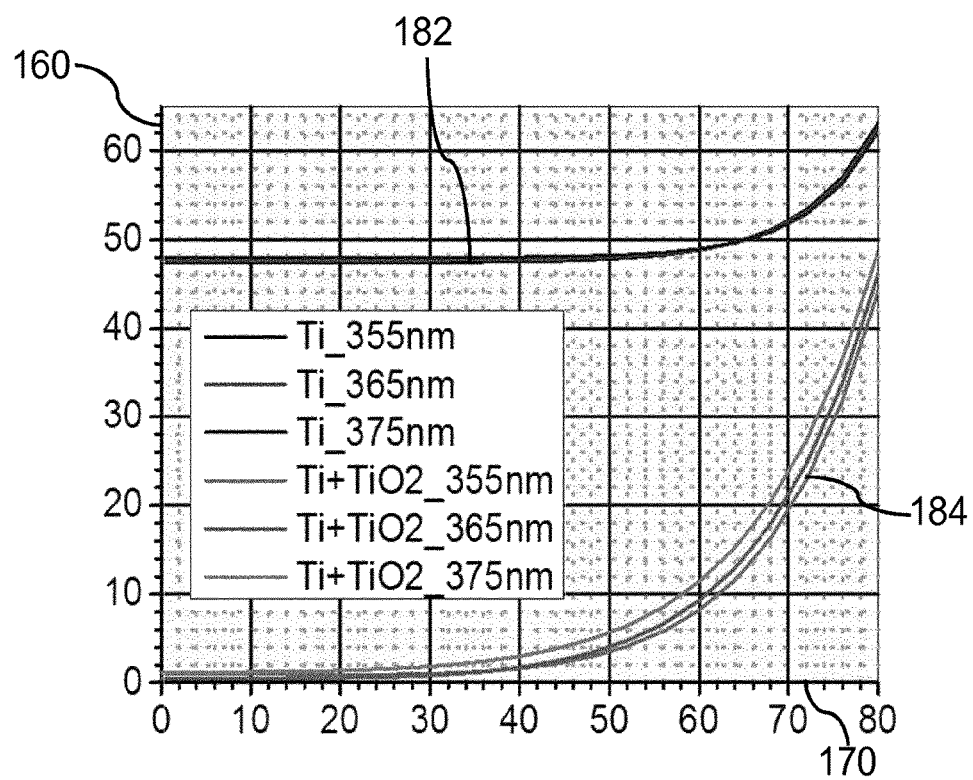
FIG. 12 shows the reduction the reflection

FIG. 12 shows the reduction of the reflection of the processing light 150 by means of a 15 nm titanium dioxide layer as described above. The abscissa 160 shows the reflection in percent. The ordinate 170 shows the angle of incidence. The reflection was calculated at three wavelengths of processing light 150 (355 nm, 365 nm, and 375 nm) for angles of incidence between 0° and 80°. Lines 182 show reflection of a 100 nm titanium layer which is around 48% for angles of incidence between 0° and 40°. The dependence of the reflection is nearly identical for all three wavelengths. Lines 184 show reflection of a 100 nm titanium layer which was oxidized such that there was a 15 nm titanium dioxide layer as described above. The dependence of the reflection is nearly identical for all three wavelengths. The reflection of processing light 150 was reduced to less than 2% for angles of incidence between 0° and around 30°. The optical material data with respect to titanium and titanium dioxide (sputtered titanium dioxide layer) have been taken from literature. The experimental results shown in FIG. 11 confirm the calculations shown in FIG. 12.

Figure 13:
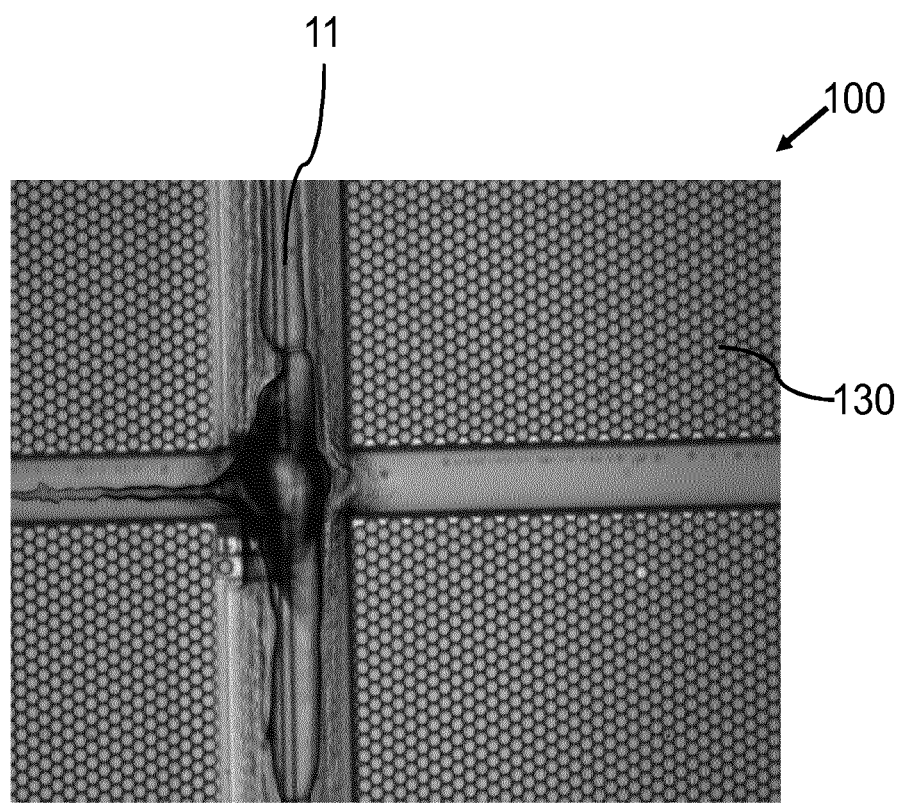
FIG. 13 shows a photograph of a first comparative example of a light emitting device

FIG. 13 shows a photograph of a first comparative example of a light emitting device 100 without processing layer 120. It was not possible to open sawing line 115 and the bond pad of the second electrical contact 114 by means of the lift-off processes.

Figure 14:
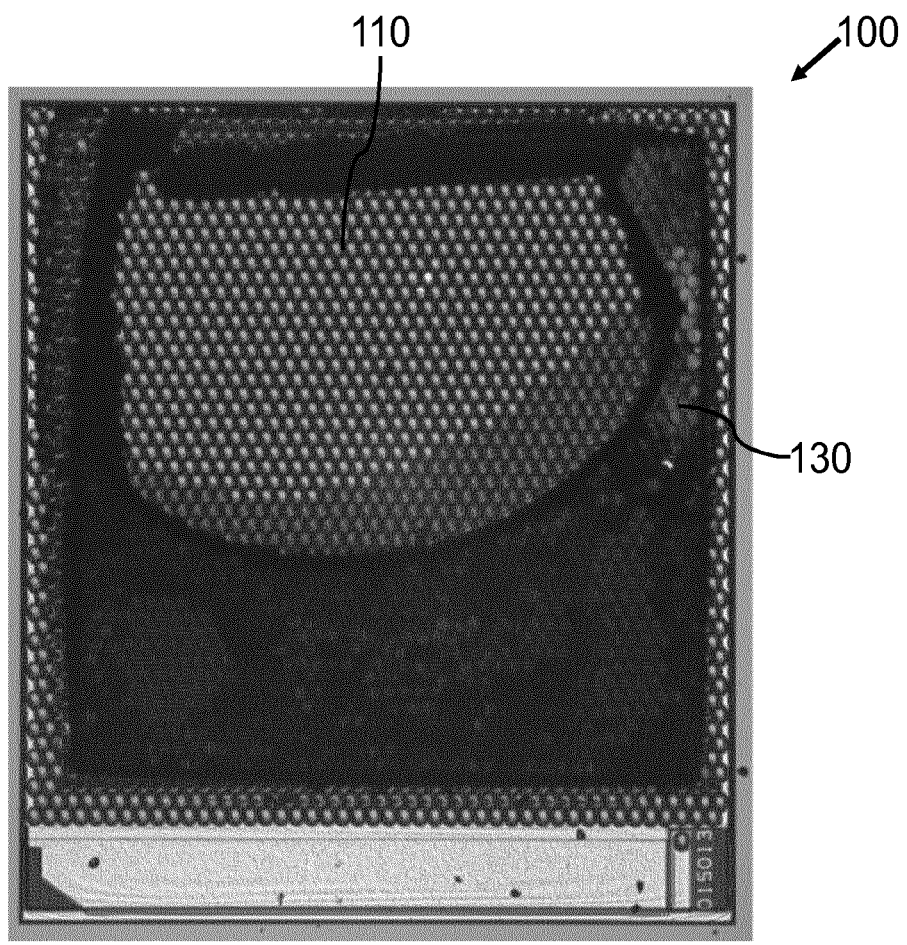
FIG. 14 shows a photograph of a second comparative example of a light emitting device

FIG. 14 shows a photograph of a second comparative example of a light emitting device 100. The optical structure 130 was processed by means of an optical forming structure 132 comprising additional vertical shielding structures in order to avoid reflected processing light 150, for example, in the volume of the optical material layer 131 above saw line 115. The processing of the optical structure 130 was successful. The optical material layer 131 could be removed by means of a washing process. Anyhow, the optical structure 130 which consisted of the same polymer material which was used in the embodiment shown in FIG. 11 and which is sold under the trade mark OrmoComp® was destroyed in the subsequent heating process. It seems that adhesion of the optical structure 130 to the light emitting structure 110 could not withstand fast thermal cycles and/or the temperature of 240° C. Processing layer 120 thus enables structuring and subsequent washing away of unnecessary optical material and it improves in addition adhesion between optical structure 130 and light emitting structure 110.

Figure 15:
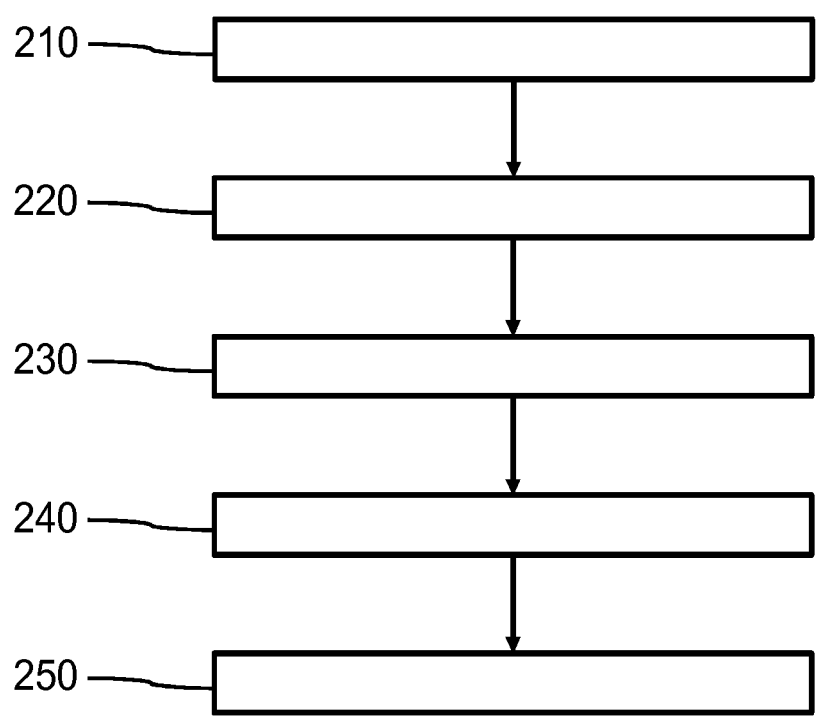
FIG. 15 shows a principal sketch of a method of manufacturing a light emitting device
In the Figures, like numbers refer to like objects throughout. Objects in the Figures are not necessarily drawn to scale.

FIG. 15 shows a principal sketch of a method of manufacturing a light emitting device 100. A light emitting structure is provided in step 210. At least one processing layer is provided in step 220. The processing layer is adapted to reduce reflection of processing light in a direction of at least one material for building an optical structure at least by 50%, preferably at least by 80%, more preferably at least by 95% and most preferably at least by 99%. In step 230 the at least one material for building the optical structure is provided. The processing light for photo processing or curing the at least one material to build the optical structure is provided in step 240. The processing layer mechanically and optically couples in step 250 the optical structure with the light emitting structure.

In order to generate polymer microlenses by photopolymerisation on top of the light emitting structures 110, but keep the polymer resin uncured on top of neighboring structures like bond pads, dicing streets (saw lines 115) etc. it is required to obscure direct processing light (i.e. by a shadow mask) and to suppress also the scattered light that may lead to unwanted polymerisation in shadow areas.

Light scattering is critical near highly reflecting and/or inclined surfaces (electrical connections, mesas etc.)

The processing layer 120 is designed to reduce scattering of the processing light. Additionally it can promote polymer adhesion.

It is thus a basic idea of the present invention to incorporate a non- or low-reflective processing layer 120 on top of a light emitting structure 110 like a VCSEL array in order to enable on wafer processing of light emitting structures 130 like microlens arrays. The processing layer 120 is adapted to avoid reflection of processing light 150 which is used to cure material of an optical structure 130 (e.g. organic or inorganic polymer) at the surface of the light emitting structure 110. The processing layer 120 may enable the reduction of reflection by absorbing the processing light 150 after passing the material of the optical structure 130. Alternatively or in addition, the processing layer may be an antireflective coating which enables absorption of the processing light 150 by means of the subsequent layer which may be, for example, a layer or layers of the light emitting structure. The processing layer 120 further needs to provide a good adhesion to the material of the optical structure and may not disturb light emission of the light emitting structure 110.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

LIST OF REFERENCE NUMERALS 100 light emitting device
110 light emitting structure
111 first electrical contact
112 semiconductor substrate
113 light emitting area
114 second electrical contact
115 saw line
120 processing layer
130 optical structure
131 optical material layer
132 optical forming structure
140 shadow mask
150 processing light 160 percentage of reflected processing light
170 angle of incidence
182 100 nm titanium layer
184 100 nm titanium layer with subsequently oxidized 15 nm titanium dioxide layer
210 step of providing light emitting structure
220 step of providing processing layer
230 step of providing material for building optical structure
240 step of providing processing light
250 step of coupling optical structure with light emitting structure

The invention claimed is:

1. A light emitting device, wherein the light emitting device comprises at least one light emitting structure, at least one processing layer and at least one optical structure, wherein the optical structure comprises at least one material processed by means of processing light, and wherein the at least one processing layer is arranged to reduce reflection of the processing light in a direction of the optical structure at least by 50% during processing of the material by means of the processing light, wherein the processing layer comprises an antireflective coating, wherein the antireflective coating is adapted to transmit the processing light to an absorption structure such that the reflection of the processing light is reduced by absorption by means of the absorption structure, and wherein a thickness of the antireflective coating is adapted such that processing light reflected at a first surface of the antireflective coating nearer to a source of the processing light destructively interferes with processing light reflected at a second surface of the antireflective coating which is directed away from the source of the processing light.

2. The light emitting device according to claim 1, wherein the at least one light emitting structure is an array of VCSEL, the array of VCSEL comprises a first electrical contact at a bottom of the array of VCSEL, the array of VCSEL further comprises a semiconductor substrate comprising laser cavities with bottom and top DBRs and active layers in between, the array of VCSEL further comprises a second electrical contact, wherein the processing layer is arranged between the second electrical contact and the at least one optical structure.

3. The light emitting device according to claim 1, wherein the at least one processing layer is adapted to avoid peeling off of the optical structure at a temperature of at least 200° C.

4. The light emitting device according to claim 1, wherein the material comprised by the optical structure comprises an ultraviolet or blue light curable polymeric material, and wherein the processing light comprises light in the wavelength range between 250 nm and 450 nm.

5. The light emitting device according to claim 4, wherein the polymeric material comprises an acrylate, a methacrylate or thiol-ene based resin in combination with at least one photoinitiator.

6. The light emitting device according to claim 1, wherein the processing layer comprises a metal layer mechanically coupled to the light emitting structure, wherein the processing layer further comprises a metal oxide layer attached to the metal layer, and wherein the metal oxide layer is the antireflective coating.

7. The light emitting device according to claim 6, wherein the metal oxide layer comprises an oxide of a material of the metal layer.

8. The light emitting device according to claim 7, wherein the metal layer is attached to gold, wherein the material of the metal layer is titanium and wherein the metal oxide layer is a titanium dioxide layer with a thickness between 10 nm and 20 nm.

9. The light emitting device according to claim 1, wherein the at least one processing layer is adapted to absorb the processing light such that the reflection of the processing light is reduced.

10. The light emitting device according to claim 1, wherein the absorption structure comprises a layer of the light emitting device.

11. The light emitting device according to claim 1, wherein the light emitting structure comprises at least one Vertical Cavity Surface Emitting Laser.

12. A method of manufacturing a light emitting device, the method comprising the steps of:
providing a light emitting structure,
providing at least one processing layer, wherein the processing layer is adapted to reduce reflection of processing light in a direction of at least one material for building an optical structure at least by 50%,
providing the at least one material for building the optical structure,
providing processing light for curing the at least one material to build the optical structure, wherein the processing layer comprises an antireflective coating, wherein the antireflective coating is adapted to transmit the processing light to an absorption structure such that the reflection of the processing light is reduced by absorption by means of the absorption structure, and wherein a thickness of the antireflective coating is adapted such that processing light reflected at a first surface of the antireflective coating nearer to a source of the processing light destructively interferes with processing light reflected at a second surface of the antireflective coating which is directed away from the source of the processing light, and
coupling the optical structure with the light emitting structure by means of the processing layer.

* * * * *